(12) United States Patent
Hartel et al.

(10) Patent No.: US 6,643,123 B2
(45) Date of Patent: Nov. 4, 2003

(54) SWITCHGEAR CABINET WITH AT LEAST ONE CABINET DOOR AND A FAN-ASSISTED AIR CIRCULATION ON AN INTERIOR

(75) Inventors: Marc Hartel, Reiskirchen (DE); Jörg Kreiling, Biebertal (DE)

(73) Assignee: Rittal GmbH & Co. KG, Herborn (DE)

( * ) Notice: Subject to any disclaimer, the term of this patent is extended or adjusted under 35 U.S.C. 154(b) by 0 days.

(21) Appl. No.: 10/205,580

(22) Filed: Jul. 25, 2002

(65) Prior Publication Data

US 2003/0035264 A1 Feb. 20, 2003

(30) Foreign Application Priority Data

Jul. 26, 2001 (DE) .......................... 101 36 457

(51) Int. Cl.⁷ ................................. H05K 7/20
(52) U.S. Cl. ..................... 361/678; 165/80.3; 200/289; 361/695; 454/184
(58) Field of Search ........................ 165/80.3, 104.33, 165/121–126; 454/184; 62/259.2, 414, 418, 419; 200/289; 312/236; 361/605–690, 692, 694–697, 724, 725, 676–678

(56) References Cited

U.S. PATENT DOCUMENTS

| 4,528,614 | A | * | 7/1985 | Shariff et al. ................ 361/678 |
| 4,535,386 | A |   | 8/1985 | Frey, Jr. et al. |
| 5,201,879 | A | * | 4/1993 | Steele ......................... 454/184 |
| 5,440,450 | A |   | 8/1995 | Lau et al. |
| 6,067,223 | A | * | 5/2000 | Diebel et al. ................. 361/676 |
| 6,463,997 | B1 | * | 10/2002 | Nicolai et al. ............. 165/80.2 |
| 6,488,214 | B1 | * | 12/2002 | Nicolai et al. ................. 237/69 |

FOREIGN PATENT DOCUMENTS

| DE | 40 08 272 C1 | 5/1991 |
| DE | 41 11 457 C1 | 10/1991 |
| DE | 195 31 310 A1 | 2/1997 |
| FR | 2.193.303 | 2/1974 |

* cited by examiner

Primary Examiner—Gerald Tolin
(74) Attorney, Agent, or Firm—Pauley Petersen & Erickson

(57) ABSTRACT

A switchgear cabinet having at least one cabinet door and a fan-assisted air circulation on an interior for cooling heat-generating devices installed inside, which are disposed one above the other in tiers. With particular air circulation, the partial cooling air flows in the tiers and can be set and adjusted, to a large extent independently of one another.

20 Claims, 3 Drawing Sheets

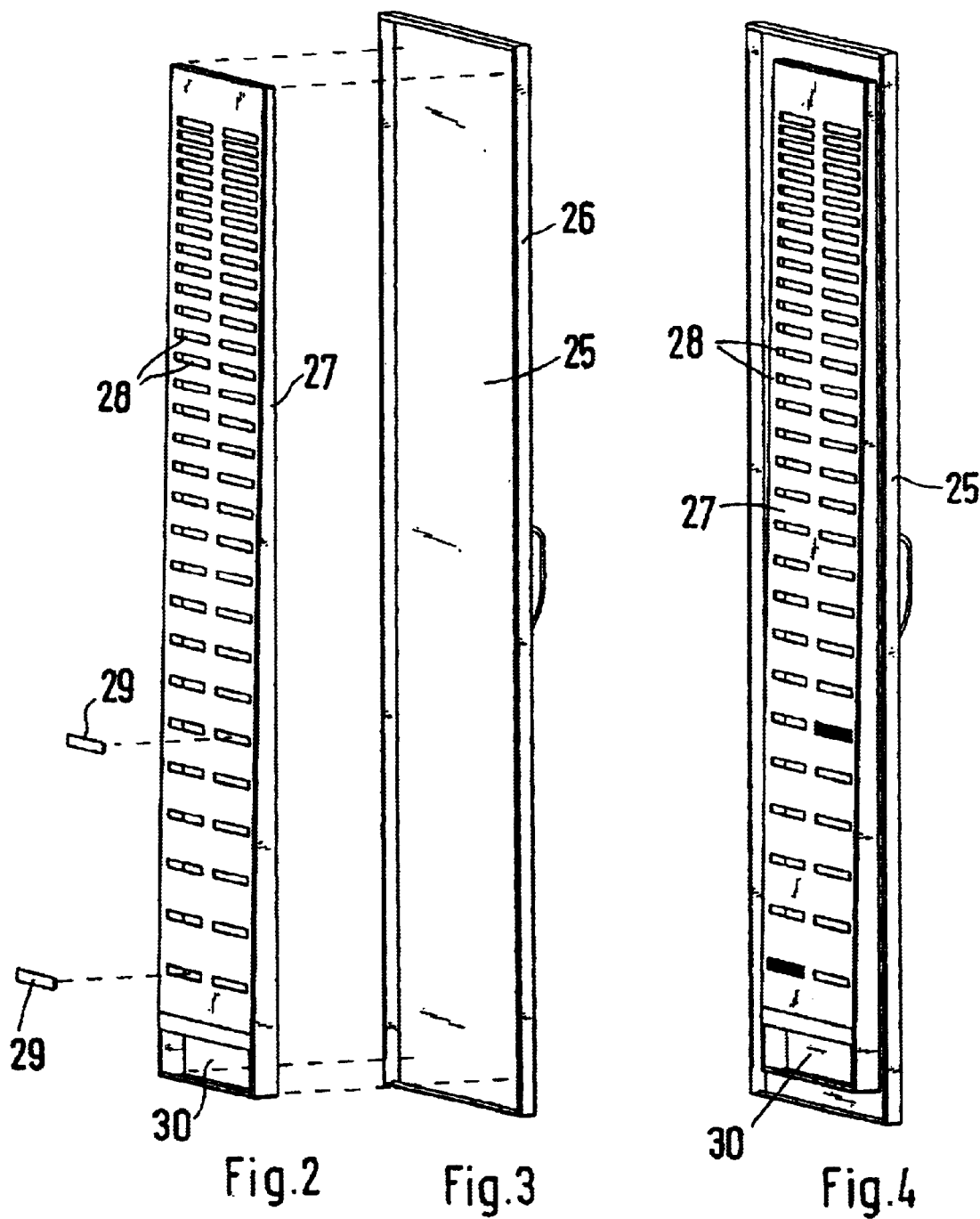

SWITCHGEAR CABINET WITH AT LEAST ONE CABINET DOOR AND A FAN-ASSISTED AIR CIRCULATION ON AN INTERIOR

BACKGROUND OF THE INVENTION

1. Field of the Invention

This invention relates to a switchgear cabinet with at least one cabinet door and with a fan-assisted air circulation on an interior for cooling heat-generating devices installed in the interior, which are disposed one above the other in tiers.

2. Description of Prior Art

When electronic devices, which generate heat but are also sensitive to heat, for example server components, are placed in closed switchgear cabinets, cooling becomes an essential factor to assure a properly functioning, trouble-free operation. Therefore numerous attempts have been made to improve cooling by optimizing air circulation on the interior of the switchgear cabinet.

As disclosed by French Patent Reference FR 2 193 303, a switchgear cabinet has devices for cooling the warm air produced on its interior, in which at least one vertical side is closed by a double-walled wall element, whose inner and outer wall panel form a large-surfaced air conduit and in which the inner wall panel has a number of openings led into it, which are distributed over its surface. The wall element acts as a sort of heat exchanger and thus has only a low efficiency. An improvement in the efficiency is only possible if the air conduit has a specially designed heat exchanger and additional fans.

German Patent Reference DE 195 31 310 A1discloses a heat exchanger for a switchgear cabinet, which can be connected as a side wall to the rack of the switchgear cabinet. Inside, part of the inner wall of the heat exchanger housing has openings and is covered by a covering plate that has lengths of tubing. The air supplied to or taken away from the heat exchanger can be aspirated from or supplied to particular locations on the interior of the switchgear cabinet by lengths of tubing.

In a switchgear cabinet according to German Patent Reference DE 40 08 272 C1, an opening is in the upper and lower region of the side wall for ventilating the interior. The openings form separate units which complete the side wall and can contain filters, fans, and the like.

As disclosed in U.S. Pat. No. 5,440,450, a fan can be built into a cooling unit so that its intake side is disposed at an acute angle to its exhaust side.

U.S. Pat. No. 4,535,386 discloses incorporating the heat exchanger into the cabinet door of a switchgear cabinet or to embody the cabinet door itself as a heat exchanger.

German Patent Reference DE 41 11 457 C1discloses a switchgear cabinet with a rack, which has frame profile sections, encased with side pieces and at least one cabinet door, and encloses a switchgear cabinet interior in which electrical assemblies are accommodated. Near at least one vertical side of the rack, a cooling unit is provided, which dissipates the heat generated on the interior of the switchgear cabinet. Instead of being connected to a side piece, the cooling unit is connected to the rack and encloses its own inner chamber in which the cooling units are accommodated. Air from the switchgear cabinet interior can be sucked into the inner chamber, cooled, and then conveyed back into the switchgear cabinet interior. In order to reduce the expense of the cooling unit, a partition is attached to the frame profile sections, parallel to and spaced apart from the side piece and together with the side piece forms a ventilation conduit. The partition has a number of openings, which spatially connect the ventilation conduit to the switchgear cabinet interior. Air can be fed through the ventilation conduit and at least one opening by a fan. The partition can be retrofitted without replacing the side piece and the switchgear cabinet can have a circulation of cooling air.

SUMMARY OF THE INVENTION

One object of this invention is to provide a switchgear cabinet of the type mentioned above but with an air circulation, which removes the generated heat in an equally favorable manner from all of the tiers disposed one above the other, independent of one another, and can be adapted to conditions in the tiers.

This object is achieved according to this invention with the bottom part of the switchgear cabinet having an air supply opening, which feeds into an air-conducting chamber. The air-conducting chamber can be supplied with external air or cooled air by the air supply opening. The air-conducting chamber is coupled to an air inlet opening of the double-walled cabinet door. The cabinet door forms a vertical air diffuser, where the inner wall of the cabinet door oriented toward the components has air outlet openings. The front ends of the components oriented toward the inner wall have air intake openings. The components have intake fans for aspirating cooling air from the air diffuser of the cabinet door. The heated air emerging from the back ends of the components travels out of the interior through ventilation openings in the rear wall of the switchgear cabinet.

The air circulation, which begins on the outside, can be fed with external air or cooled ambient air. The air-conducting chamber is connected only to the air diffuser of the double-walled cabinet door. The air diffuser distributes cooling air over the entire front. Each component can aspirate cooling air from the air diffuser individually since each has its own intake fan and its intake opening is situated in the immediate vicinity of air outlet openings of the air diffuser. The heated air emerging from the back ends of the components travels through ventilation openings of the rear wall, directly into the surroundings of the switchgear cabinet.

The horizontal partial flows of the cooling air can be adjusted and/or regulated individually by the intake fans. The same purpose is served if air outlet openings of the inner wall of the cabinet door can be closed by covers that can be inserted over the air outlet openings.

According to one embodiment, the components are closed components, in particular server units. This obviates the need for structural sheet metal between the components.

The coupling of the air-conducting chamber in the lower region of the switchgear cabinet to the air diffuser of the double-walled cabinet door is configured so that the air-conducting chamber, in the lower region of the front, ends in a rectangular air outlet opening, which is flush with the air inlet opening of the closed cabinet door.

The cables for connecting the components can be fed into the interior of the switchgear cabinet without impairing the air circulation because the air-conducting chamber has a cable entry.

The air diffuser in the cabinet door is produced in an extremely simple manner, a box-like inner wall with air outlet openings is inserted into the cabinet door, which has a folded edge.

In order to assure that a sufficient amount of cooling air emerges from the air diffuser of the cabinet door, in one embodiment of this invention, the air outlet openings of the inner wall are horizontal slots and are arranged in vertical rows. In order to compensate for the different lengths of the paths, it is also possible for the spacing of the air outlet openings in the vertical rows to decrease from bottom to top.

In order to obtain the most individual possible horizontal partial cooling air flows, in one embodiment the inner wall of the closed cabinet door is situated directly in front of the front ends of the components with the intake openings, which components are arranged one above the other in tiers. The rear wall has ventilation openings and directly adjoins the back ends of the components. The back ends of the components have air outlets.

If the rear wall has ventilation openings formed as horizontal slots and arranged in uniformly spaced vertical rows, then the removal of the heated partial flows is also not reciprocally influenced.

This invention can also be embodied as an additional cabinet door in order to facilitate access to the components.

BRIEF DESCRIPTION OF THE DRAWINGS

This invention is explained in detail below in view of an exemplary embodiment shown in the drawings, wherein:

FIG. 2 shows a perspective view of an inner wall having air outlet openings, which is intended for a cabinet door according to FIG. 3;

FIG. 3 shows a perspective view of a cabinet door;

FIG. 4 shows a perspective view of an air diffuser having an inner wall according to FIG. 2 and a cabinet door 25 according to FIG. 3.

DESCRIPTION OF PREFERRED EMBODIMENTS

Figure 1:
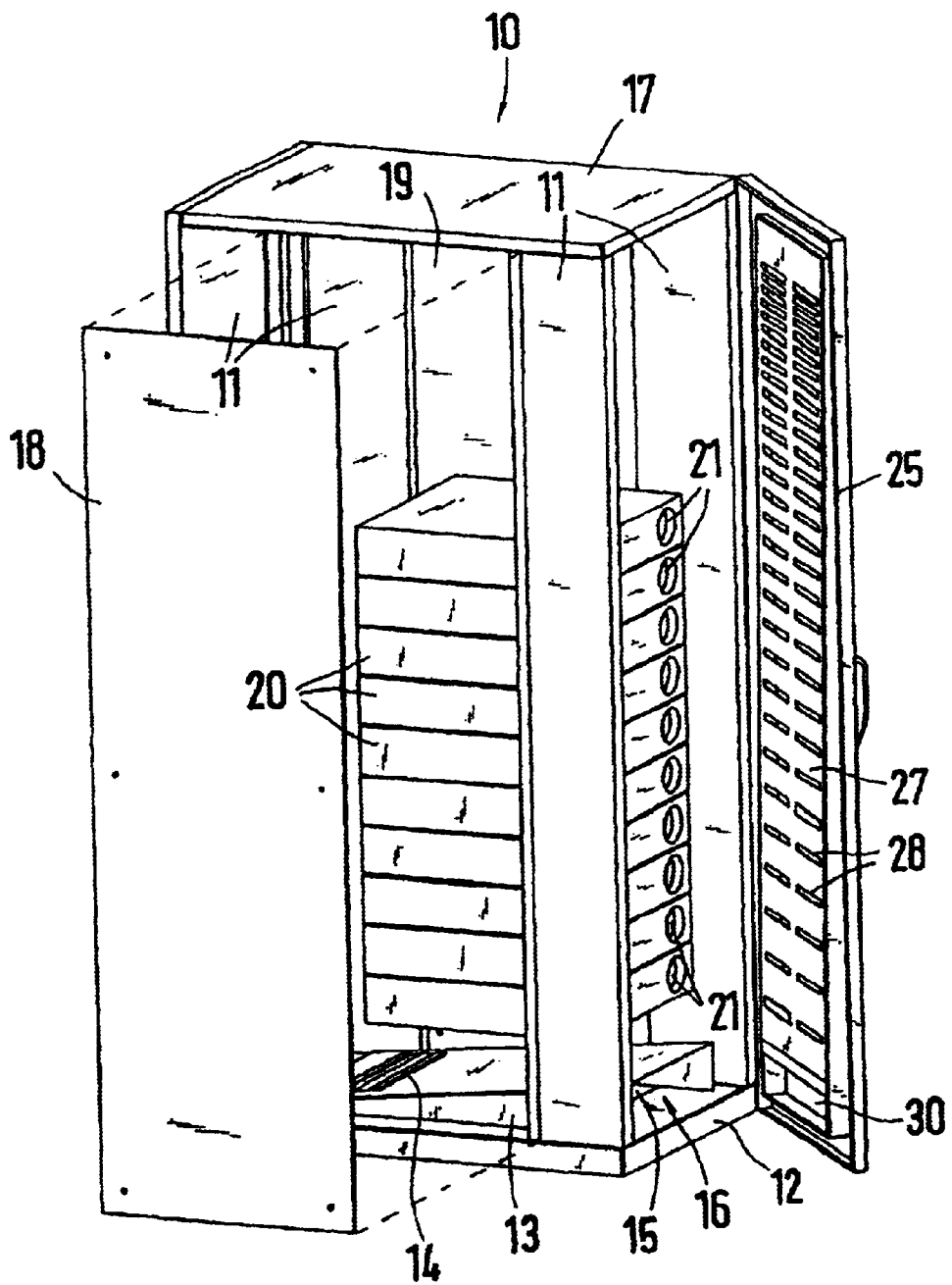
FIG. 1 shows a perspective view of a switchgear cabinet with closed components arranged in tiers and a cooling air circulation, according to this invention.

The basic design of the switchgear cabinet 10 is not crucial to this invention. In the exemplary embodiment, four vertical supports 11, a bottom part 12, and a top wall 17 form the cabinet rack, which can be enclosed by a cabinet door 25, two side walls 18 and 19, and a rear wall 23. The rear wall 23 is also embodied as a cabinet door and can be attached to the cabinet rack, as shown in FIG. 1.

One important aspect is that the cooling of the electronic components 20, disposed in tiers arranged one above the other on the interior, are preferably closed, and are embodied as server units. The components 20 generate heat and are sensitive to heat, thus sufficient cooling is necessary.

The cooling air can be supplied, in the form of external air or cooled ambient air, into an air-conducting chamber 13 by an air supply opening 15 in the bottom of the switchgear cabinet 10. The air-conducting chamber 13 covers the air supply opening 15 and opens out, in the vicinity of the front, in a rectangular air outlet opening 16.

With an inner wall 27 as shown in FIG. 2, the cabinet door 25 according to FIG. 3 becomes an air diffuser, which extends over the entire front of the switchgear cabinet 10. The box-like inner wall 27 that has rows of air outlet openings 28 is inserted into the cabinet door 25, which has a folded edge 26. An air inlet opening 30 is provided in the lower region of the inner wall 27 and when the cabinet door 25 is closed, the air inlet opening 30 is situated immediately in front of the air outlet opening 16 of the air-conducting chamber 13 and is flush with the air outlet opening 16. The air outlet openings 28 of the inner wall 27 are embodied as horizontal slots whose spacing decreases from bottom to top.

The components 20 are lined up compactly above the air-conducting chamber 13, which has only one cable entry 14. The front ends of the components 20 have at least one intake opening 21. The distance of the intake openings 21 from the air outlet openings 28 of the closed cabinet door 25 is very short so that the intake fans integrated into the components 20 can aspirate individual partial cooling air flows from the air diffuser of the cabinet door 25. The individual intake fans can set and regulate the partial cooling air flows individually.

Figure 5:
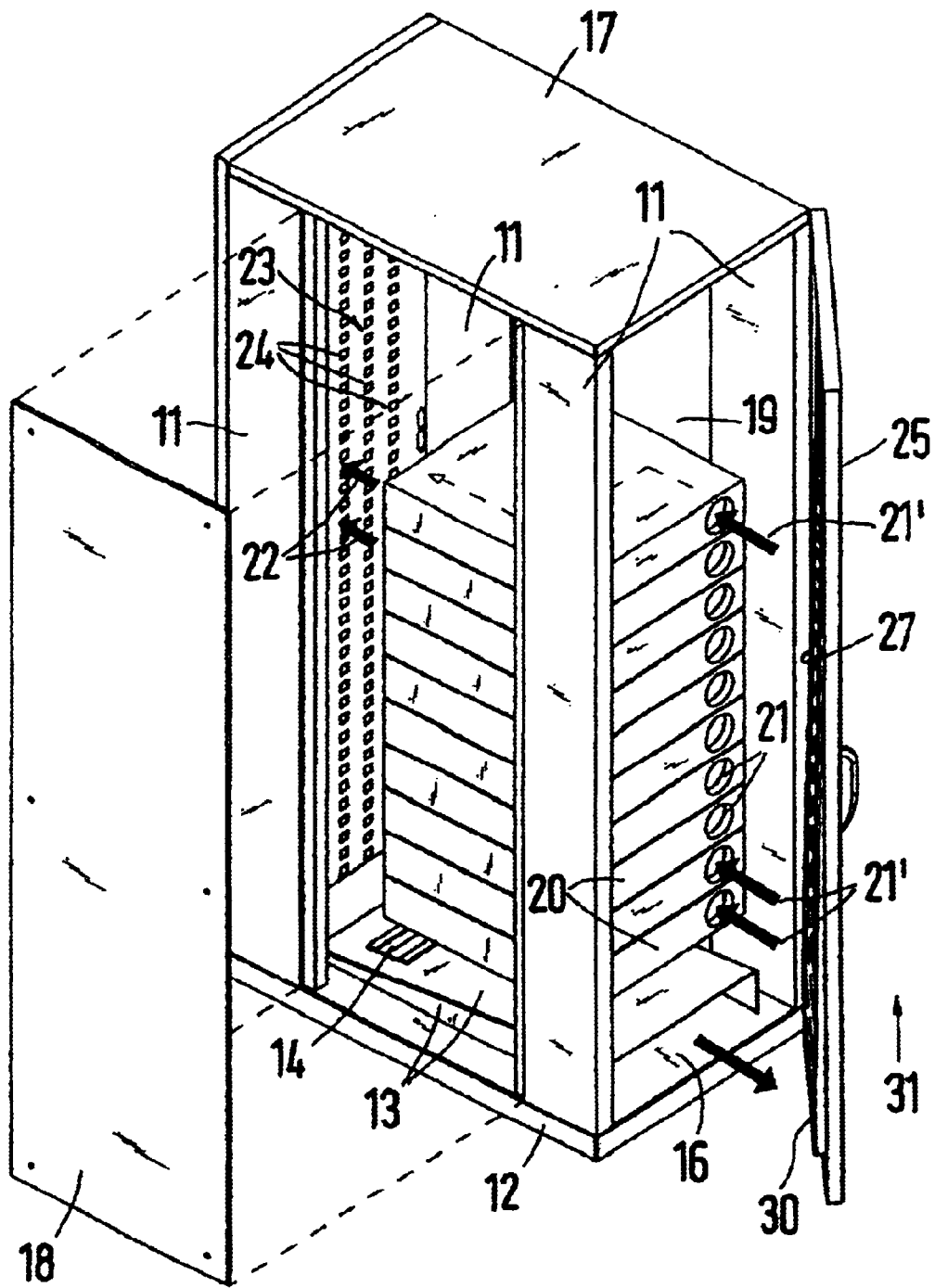
FIG. 5 shows the switchgear cabinet according to FIG. 1, in a different perspective view, which also shows a rear of the switchgear cabinet.

As shown in FIG. 5, the partial cooling air flows 21', after passing through the components 20, emerge at their back ends in the form of heated partial flows 22 and travel directly into the surroundings of the switchgear cabinet 10 by cooling openings 24 in the rear wall 23.

The rear wall 23, which is embodied as a cabinet door and is attached to the cabinet rack, also has rows of ventilation openings 24, which can be embodied as horizontal slots and spaced uniformly apart.

With this routing of the cooling air, the components 20 can be individually cooled and the partial cooling air flows can be set and regulated, to a large extent independently of one another. Thus, the covers 29 can close air outlet openings 28 of the inner wall, thus changing the aspirated partial flow.

German Patent Reference 101 36 457.1-34, the priority document corresponding to this invention, and its teachings are incorporated, by reference, into this specification.

What is claimed is:

1. In a switchgear cabinet having at least one cabinet door and a fan assisted air circulation on an interior for cooling heat-generating devices installed in the interior which are disposed one above the other in tiers, the improvement comprising: a bottom part (12) of the switchgear cabinet (10) having an air supply opening (15) which feeds into an air-conducting chamber (13), the air-conducting chamber (13) supplied with one of external air and cooled air by the air supply opening (15), the air-conducting chamber (13) coupled to an air inlet opening (30) of a double-walled cabinet door (25, 27), the cabinet door (25) having a vertical air diffuser, an inner wall (27) of the cabinet door (25) oriented toward components (20) having air outlet openings (28), front ends of the components (20) oriented toward the inner wall (27) having air intake openings (21), the components (20) having intake fans for aspirating cooling air from the air diffuser of the cabinet door (25), and heated air emerging from back ends of the components (20) traveling out of the interior through ventilation openings (24) of a rear wall (23) of the switchgear cabinet.

2. In the switchgear cabinet according to claim 1, wherein the components (20) are closed components.

3. In the switchgear cabinet according to claim 2, wherein the air-conducting chamber (13) in a lower region of a front terminates in a rectangular air outlet opening (16) which is flush with the air inlet opening (30) of the closed cabinet door (25).

4. In the switchgear cabinet according to claim 3, wherein the air-conducting chamber (13) has a cable entry (14).

5. In the switchgear cabinet according to claim 4, wherein a box-like inner wall (27) having air outlet openings (28) is inserted into the cabinet door (25) which has a folded edge (26).

6. In the switchgear cabinet according to claim 5, wherein the air outlet openings (28) of the inner wall (27) are horizontal slots arranged in vertical rows.

7. In the switchgear cabinet according to claim 6, wherein spacings of the air outlet openings (28) in the vertical rows decrease from a bottom to a top.

8. In the switchgear cabinet according to claim 7, wherein the inner wall (27) of the closed cabinet door (25) is positioned directly in front of the front ends of the components (20) with the intake openings (21), the components (20) are arranged one above the other in tiers, the rear wall (23) having second ventilation openings (24) directly adjoins the back ends of the components (20), and the back ends of the components (20) have air outlets.

9. In the switchgear cabinet according to claim 8, wherein the second ventilation openings (24) of the rear wall (23) are embodied as horizontal slots and arranged in uniformly spaced vertical rows.

10. In the switchgear cabinet according to claim 9, wherein the rear wall (23) is a cabinet door.

11. In the switchgear cabinet according to claim 10, wherein the air outlet openings (28) of the inner wall (27) of the cabinet door (25) are closed by covers (29) inserted over the air outlet openings (28).

12. In the switchgear cabinet according to claim 1, wherein the air-conducting chamber (13) in a lower region of a front terminates in a rectangular air outlet opening (16) which is flush with the air inlet opening (30) of the closed cabinet door (25).

13. In the switchgear cabinet according to claim 1, wherein the air-conducting chamber (13) has a cable entry (14).

14. In the switchgear cabinet according to claim 1, wherein a box-like inner wall (27) having air outlet openings (28) is inserted into the cabinet door (25) which has a folded edge (26).

15. In the switchgear cabinet according to claim 14, wherein the air outlet openings (28) of the inner wall (27) are horizontal slots arranged in vertical rows.

16. In the switchgear cabinet according to claim 15, wherein spacings of the air outlet openings (28) in the vertical rows decrease from a bottom to a top.

17. In the switchgear cabinet according to claim 1, wherein the inner wall (27) of the closed cabinet door (25) is positioned directly in front of the front ends of the components (20) with the intake openings (21), the components (20) are arranged one above the other in tiers, the rear wall (23) having second ventilation openings (24) directly adjoins the back ends of the components (20), and the back ends of the components (20) have air outlets.

18. In the switchgear cabinet according to claim 1, wherein second ventilation openings (24) of the rear wall (23) are embodied as horizontal slots and arranged in uniformly spaced vertical rows.

19. In the switchgear cabinet according to claim 1, wherein the rear wall (23) is a cabinet door.

20. In the switchgear cabinet according to claim 1, wherein the air outlet openings (28) of the inner wall (27) of the cabinet door (25) are closed by covers (29) inserted over the air outlet openings (28).

* * * * *